US010615035B2

(12) United States Patent
Kanukuntla et al.

(10) Patent No.: US 10,615,035 B2
(45) Date of Patent: Apr. 7, 2020

(54) METHOD OF REDUCING LIFT-OFF RELATED REDEPOSIT DEFECTS ON SEMICONDUCTOR WAFERS

(71) Applicant: II-VI Delaware, Inc., Wilmington, DE (US)

(72) Inventors: Pallav Kanukuntla, Edison, NJ (US); Ashamin Rampersad, Skillman, NJ (US)

(73) Assignee: II-VI Delaware, Inc., Wilmington, DE (US)

( * ) Notice: Subject to any disclaimer, the term of this patent is extended or adjusted under 35 U.S.C. 154(b) by 0 days.

(21) Appl. No.: 16/114,332

(22) Filed: Aug. 28, 2018

(65) Prior Publication Data

US 2020/0075317 A1 Mar. 5, 2020

(51) Int. Cl.

*H01L 21/027* (2006.01)
*H01L 21/02* (2006.01)
*H01S 5/42* (2006.01)

(52) U.S. Cl.

CPC ........ *H01L 21/0273* (2013.01); *H01L 21/022* (2013.01); *H01L 21/0272* (2013.01); *H01L 21/02112* (2013.01); *H01L 21/02252* (2013.01); *H01S 5/423* (2013.01)

(58) Field of Classification Search

None

See application file for complete search history.

(56) References Cited

U.S. PATENT DOCUMENTS

| | | | | |
|---|---|---|---|---|
| 8,052,854 B1 * | 11/2011 | Hunter | G01N 33/004 204/424 |
| 9,865,469 B2 | 1/2018 | Cheng et al. | |
| 9,941,168 B1 | 4/2018 | Kim et al. | |
| 2005/0100830 A1 * | 5/2005 | Xu | B29C 43/003 430/322 |

* cited by examiner

*Primary Examiner* — Dung A. Le
(74) *Attorney, Agent, or Firm* — Wendy W. Koba

(57) ABSTRACT

A plasma treatment is utilized prior to a conventional lift-off process to increase the hydrophilic characteristics of the surface of the sacrificial metal over the photoresist and minimize its ability to redeposit on the wafer surface. Highly-energized atoms (or molecules) in the plasma interact with the surface atoms of the metal, creating a temporary hydrophilic condition at the surface. This increased wettability of the metal layer surface thus minimizes the probability that subsequently removed thin film metal will be able to bond with the wafer surface. The metal layer may comprise a typical stack of Ti/Pt/Au, and the plasma treatment may use an $O_2$-based plasma or a $CF_4$-based plasma, among others.

14 Claims, 6 Drawing Sheets

REDEPOSIT WITH Au SIDE UP

REDEPOSIT WITH Ti SIDE UP

CONTACT ANGLE BEFORE PLASMA TREATMENT

CONTACT ANGLE AFTER PLASMA TREATMENT

METHOD OF REDUCING LIFT-OFF RELATED REDEPOSIT DEFECTS ON SEMICONDUCTOR WAFERS

TECHNICAL FIELD

The present invention relates to semiconductor wafer processing and, more particularly, to a method of reducing the redeposit of metallic contact material during a lift-off process.

BACKGROUND OF THE INVENTION

In the process of forming a thin film metal contact using a conventional lift-off technique, it is typical for some portions of the "lifted off" material film to redeposit on the wafer surface. These redeposits form temporary bonds with the wafer surface and are difficult to remove, even by performing a second lift-off process. As a result, any of the individual die on a given wafer that are found to include these redeposits must be discarded, impacting the yield of the final acceptable devices.

SUMMARY OF THE INVENTION

The present invention relates to the inclusion of an additional step in the conventional lift-off process that (temporarily) makes the metal's surface hydrophilic and thus reduces the probability that any portions of the removed metal will adhere to the wafer's surface and remain as an unwanted redeposit on the final structure.

In accordance with the principles of the present invention, a metal contact layer-coated wafer is subjected to a plasma treatment prior to beginning a conventional lift-off process (which typically involves spraying the wafer with a known solvent that dissolves the photoresist and thus "lifts off" the metallic film covering the photoresist). Highly-energized atoms (or molecules) in the plasma interact with the surface atoms of the metal, creating a temporary hydrophilic condition at the surface. This increased wettability of the metal layer surface thus minimizes the probability that any subsequently removed portions of the metal will be able to bond with the wafer surface.

Besides creating a hydrophilic surface, it has been found that the plasma treatment is also beneficial in removing organic contaminants from the structure.

An exemplary embodiment of the present invention takes the form of a method of manufacturing a semiconductor device using a lift off process, including the steps of: (1) forming a layer of photoresist over a top major surface of a substrate (the substrate previously processed to include regions of a specific semiconductor device structure); (2) patterning the layer of photoresist to expose selected regions of the substrate associated with the provision of electrical connection to the semiconductor device; (3) depositing a metal contact layer over the patterned layer of photoresist material and the exposed regions of the substrate; (4) exposing the metal contact layer to a plasma treatment under conditions sufficient to create a hydrophilic surface on the metal contact layer; and (5) removing the layer of photoresist and overlying portions of the metal contact layer using a lift-off solvent. In accordance with the present invention, the creation of the hydrophilic surface reduces redeposit of portions of the removed metal contact material on exposed regions of the substrate.

Other and further embodiments of the present invention will be described during the course of the following discussion and by reference to the accompanying drawings.

BRIEF DESCRIPTION OF THE DRAWINGS

Referring now to the drawings.

DETAILED DESCRIPTION

Figure 1:
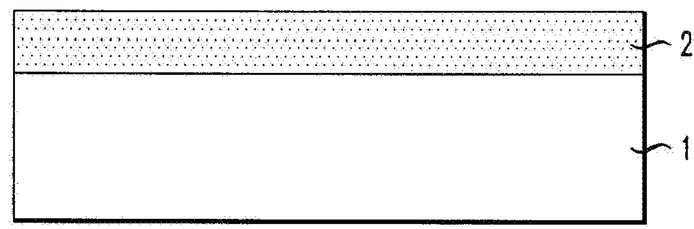
FIGS. 1-5 illustrate a set of steps depicting a conventional, prior art lift-off process.
Figure 2:
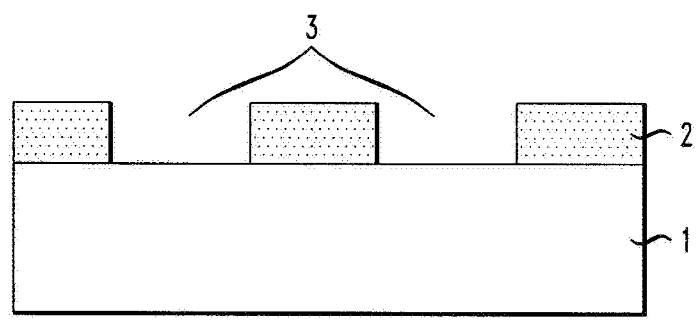
Figure 3:
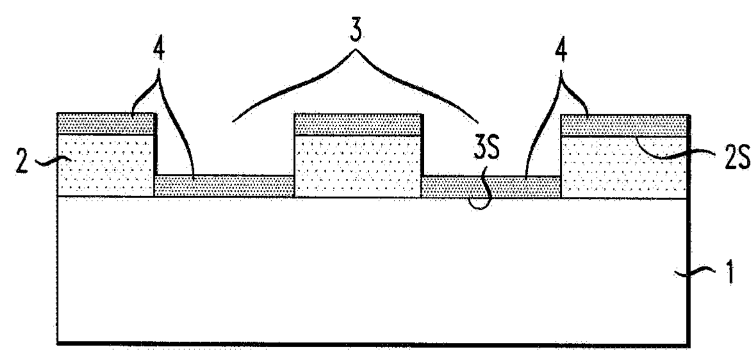

As mentioned above, lift-off is a technique used in some semiconductor fabrication processes to create a patterned layer of target material (for example, metal) on a wafer structure. FIGS. 1-5 illustrate a set of typical prior art process steps used in performing a typical lift-off technique. FIG. 1 illustrates a starting material for the process, in the form of a substrate 1 that has presumably been processed to include various semiconductor devices/regions (not specifically shown). To begin the formation of a metal contact structure using a lift-off process, substrate 1 is initially covered with a photoresist material 2. Photoresist material 2 is subsequently patterned, using well-known techniques, to expose regions 3 where it is desired to form the layer of target material. This step in the process is shown in FIG. 2.

Figure 4:
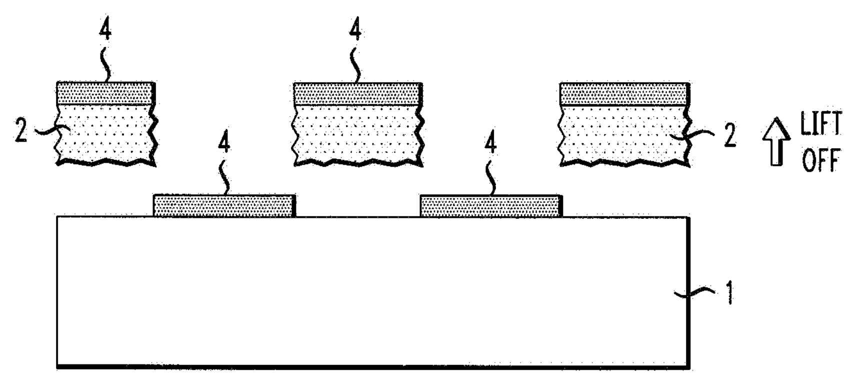

Once patterned, a layer 4 of the target material is deposited (perhaps using an evaporation process, for example) to coat the top surface of the structure, including both a top surface 2S of the remaining areas of photoresist 2 and a top surface 3S of all exposed wafer surface regions 3. At this stage in the process, actual "lift off" is then performed to remove the remaining areas of photoresist 2 and the unwanted target material 4 covering these areas of photoresist 2. In most cases, a solvent is applied to wash off the photoresist, as shown in FIG. 4, where the washing also removes the portions of target material 4 that cover photoresist 2.

Figure 5:
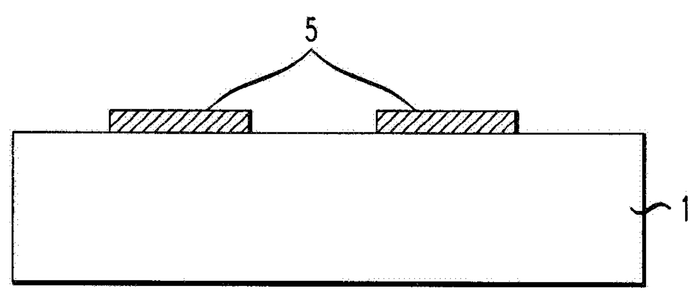
Figure 6:
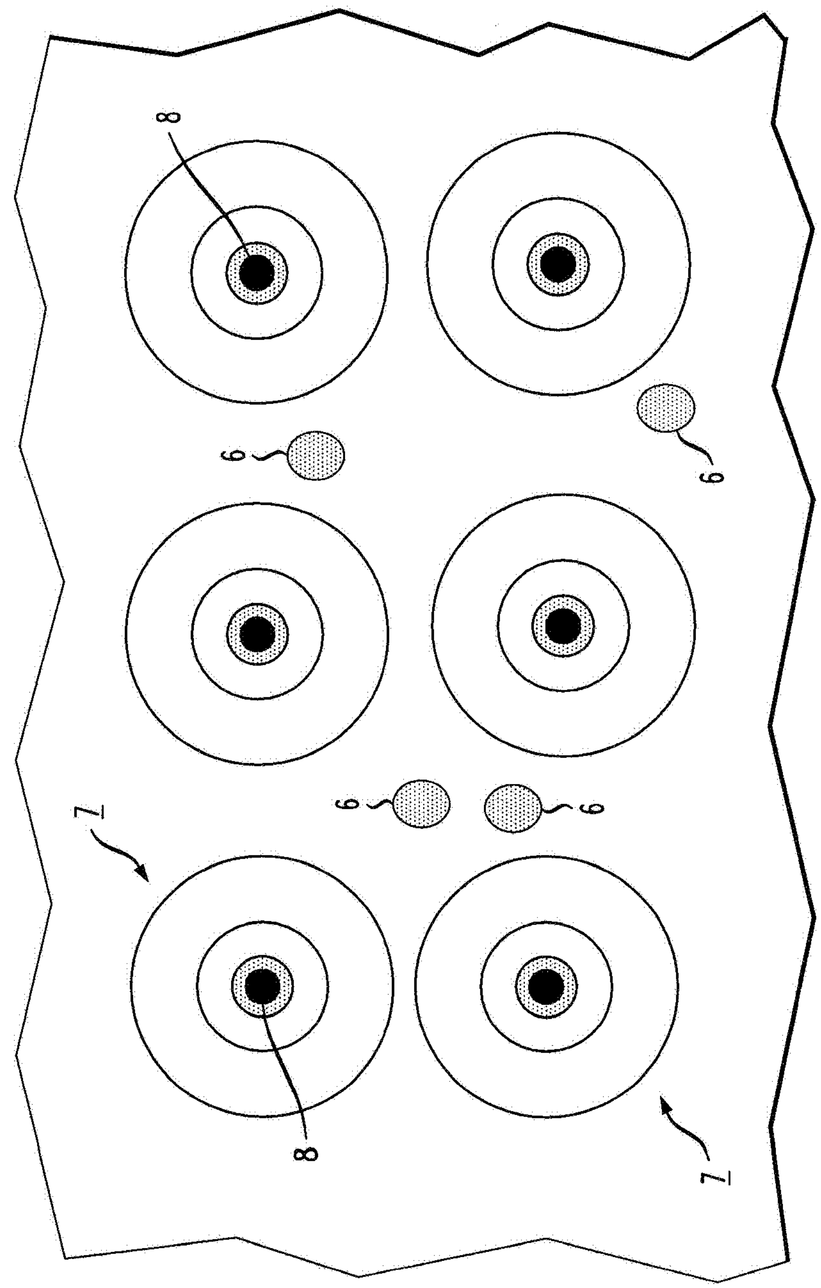
FIG. 6 is a top view of a set of vertical cavity surface emitting lasers, illustrating the redeposit of several discs of metal contact material previously removed during a conventional lift-off process.
Figure 7:
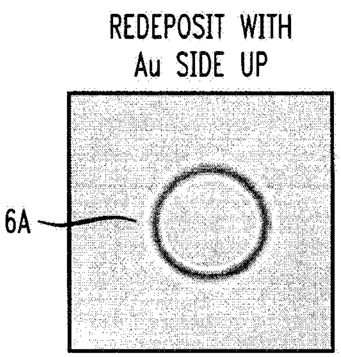
FIG. 7 is a photograph of an exemplary metal disc redeposited during a conventional lift-off process, in this case illustrating a "gold-side-up" redeposit of a three-layer disc of Ti/Pt/Au.
Figure 8:
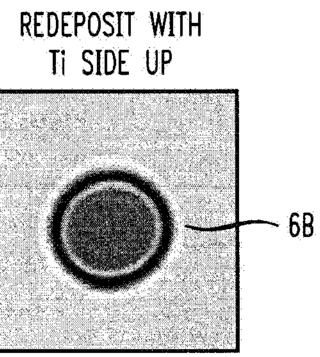
FIG. 8 is a photograph of an exemplary metal disc redeposited during a conventional left-off process, in this case illustrating a "titanium-side-up" redeposit of a three-layer disc of Ti/Pt/Au.

While in the ideal case the result is the structure as shown in FIG. 5, with layer 4 remaining only in regions 3 to form metal contacts 5, some of the washed-off target material of layer 4 is known to redeposit in unwanted areas on the wafer surface. FIG. 6 is a diagram depicting an exemplary redeposit, with a set of discs 6 of target material redepositing on the surface of the final structure. In this example, the structure is illustrated as a set of vertical cavity surface emitting lasers (VCSELs) 7, with discs 6 being extremely small and thin metals lifted off of circular emitter regions 8 of VCSELs 7 (it is to be noted that not necessarily all of the material lifted off of the emitter regions will redeposit). In a typical VCSEL fabrication process using lift-off to remove a tri-layer metal stack of Ti/Pt/Au, these emitter region discs are found to re-attach to the wafer surface either Ti-side down (i.e., Au-side up) or Au-side down (Ti-side up) and are difficult to remove, even with the application of additional solvent. FIG. 7 is a photograph of an exemplary disc 6A redeposited Au-side up on an exemplary substrate, and FIG. 8 is a photograph of an exemplary disc 6B redeposited Ti-side up on a substrate.

In accordance with the teachings of the present invention, a plasma treatment is introduced into the lift-off process to increase the wettability of the surface metal layer (such as layer 4 discussed above) and minimize the probability that any removed metal, such as the discs from the emitter regions of VCSELs, will redeposit on the wafer surface. The plasma treatment is used after the metal contact layer has been deposited on the wafer, and prior to the application of the lift-off solvent used to remove the photoresist.

Highly-energized atoms (or molecules) in the plasma interact with the surface atoms on the metal layer, where for the purposes of the present invention the appropriate treatment conditions and plasma gas mixtures are selected to change the surface into a hydrophilic structure. The plasma treatment conditions include, but are not limited to, the pressure at which the treatment is performed (which may range from one to several Torr, for example), the RF power used to generate the plasma (which may range over hundreds of watts), and the time duration of the plasma treatment (seconds to a few minutes, for example). In terms of plasma gas mixtures, various gases used in plasma-based semiconductor processes may be used, with specific flow rates and associated carrier gases used. When performing a lift-off of a thin film metal Ti/Pt/Au structure, for example, plasmas based on $O_2$ or $CF_4$ have been successfully used.

Figure 9:
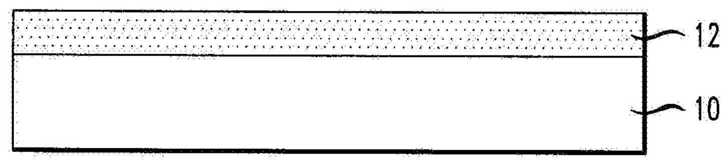
FIGS. 9-14 illustrate a set of steps showing the use of a plasma treatment in the lift-off process of the present invention.
Figure 10:
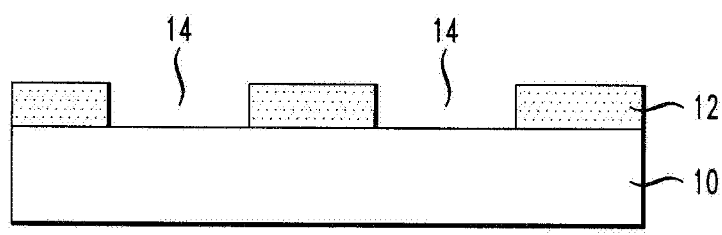

FIGS. 9-14 illustrate an exemplary set of process steps for reducing metal redeposit during lift-off in accordance with the principles of the present invention. As discussed above, once the fabrication of various semiconductor device layers/regions is completed, a final step is to form metal contacts in certain areas (e.g., “anode” contacts). The tri-layer metal stack of Ti/Pt/Au is typically used for this purpose and applied in selected contact regions by using a lift-off process. The formation of metal contacts begins, as shown in FIG. 9, by depositing a photoresist material 12 (or any other suitable type of pattern transferring material) to cover a top surface 12S of the processed substrate 10. Photoresist layer 12 is subsequently patterned, using well-known techniques, to expose regions 14 where it is desired to form the metal contacts for the device structure. This patterning of photoresist layer 12 to create contact regions 14 is shown in FIG. 10.

Figure 11:
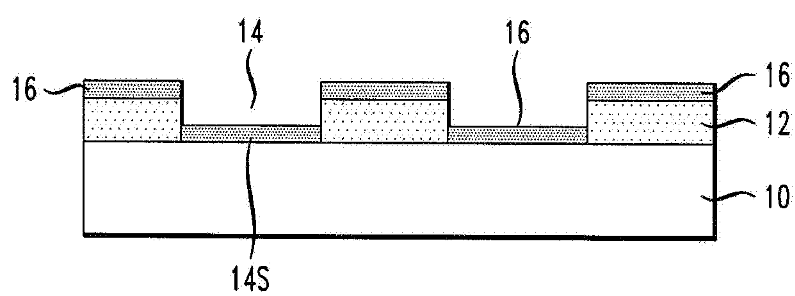

Once contact regions 14 have been defined, a layer 16 of the target material (for example, a tri-layer stack of Ti/Pt/Au) is deposited (or evaporated, as the case may be) to coat the top surface of the structure, including both top surface 12S of the remaining areas of photoresist layer 12 and top surfaces 14S of exposed contact regions 14. FIG. 11 illustrates the structure at this point in the process, with metal layer 16 disposed to cover the entire exposed surface (that is, both the surface of remaining photoresist layer 12 and the exposed regions 14). It is to be understood that while a tri-layer stack of Ti/Pt/Au is a thin film metal composition used in many cases as a contact metal layer, the process of the present invention may be used to reduce the redeposit of any type of metal film used in the fabrication of semiconductor devices. Indeed, the inventive plasma treatment can be configured (in terms of process parameters and selected gases) to increase the hydrophilic nature of a top surface of any metal layer used for these purposes.

Figure 12:
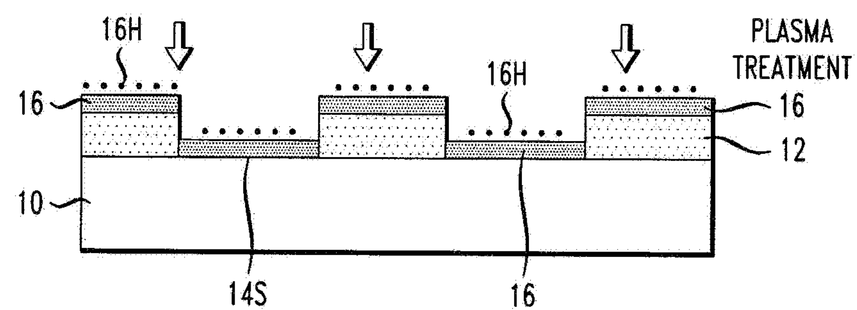

In accordance with the present invention, therefore, once metal contact layer 16 has been deposited, the structure is subjected to a plasma treatment that changes a surface of contact metal layer 16 into a hydrophilic structure, denoted as 16H. This is depicted in FIG. 12, where a plasma treatment is used to increase the wettability of the surface of metal contact layer 16, creating hydrophilic surface 16H. As shown and by virtue of the exposure during the plasma treatment, the complete surface of layer 16 becomes hydrophilic, including both the portions of layer 16 deposited in contact regions 14 and the portions of layer 16 deposited over the remaining photoresist 12. When layer 16 comprises the tri-layer stack of Ti/Pt/Au, the plasma treatment functions to increase the hydrophilic nature of the surface layer of gold. The hydrophilic nature of surface 16H is only temporary, where this state is a function of the time duration of the plasma exposure. For the purposes of the present invention, exposures in the range of, for example, 30 seconds to a few minutes have been found successful (where this exposure time is, of course, a function of parameters including, but not limited to, the plasma energy imparted to surface 16H). It is to be understood that other exposure durations, as well as process parameters such as pressure, RF power, flow rate, etc., are all design choices involved in performing a plasma treatment as part of the inventive lift-off process.

Figure 13:
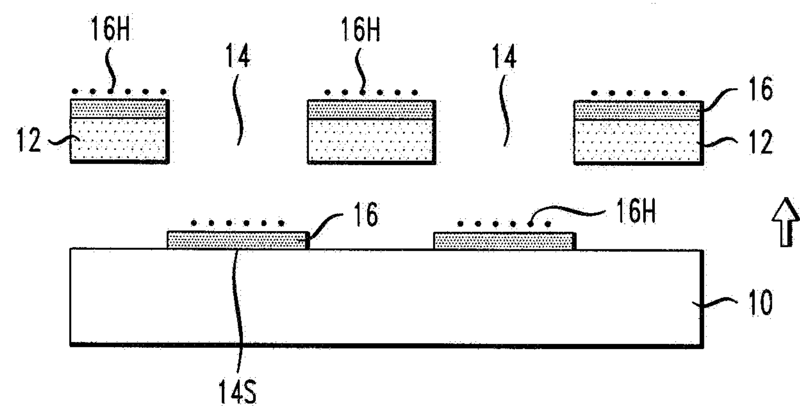
Figure 14:
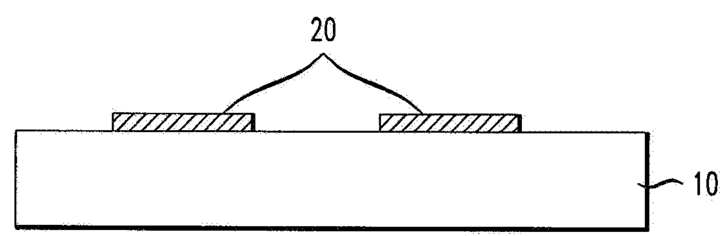

After this plasma treatment, a conventional lift-off technique is used to remove the plasma-treated, now hydrophilic, metal and underlying photoresist. As mentioned above, lift-off is typically performed by applying a solvent to the structure that dissolves the photoresist and washes away the unwanted portions of the metal attached to the photoresist. This is shown in FIG. 13. In accordance with the present invention, the increase in the wettability of layer 16 (illustrated by hydrophilic surface 16H) substantially reduces the likelihood that these pieces of lifted-off metal will redeposit and bond to the surface of substrate 10. As mentioned above, the hydrophilic state of layer 16 is only temporary. Therefore, the final device structure as shown in FIG. 14 no longer exhibits this increased wettability and the process of the present invention results in the formation of metal contacts 20 on substrate 10, with little or no metal redeposit on the surface of substrate 10 as found in the prior art.

In one exemplary embodiment, an oxygen ($O_2$)-based plasma may be used to create a hydrophilic state across an exposed surface of a contact metal layer. When used with a conventional tri-layer stack of Ti/Pt/Au, for example, the O2-based plasma treatment increases the wettability of the gold surface layer. One exemplary $O_2$-based plasma treatment may be performed at a pressure of, for example, 2.75 Torr, with an $O_2$/Ar flow of 33 sccm (Ar used as a carrier gas in the process), and an RF plasma power of 175 W. With these parameters, a structure subjected to a plasma treatment for about a minute has been found to exhibit the desired hydrophilic surface state. Other plasma process parameters (in terms of pressure, plasma energy, etc.) may be successfully used and are considered as falling within the scope of the present invention.

Figure 15:
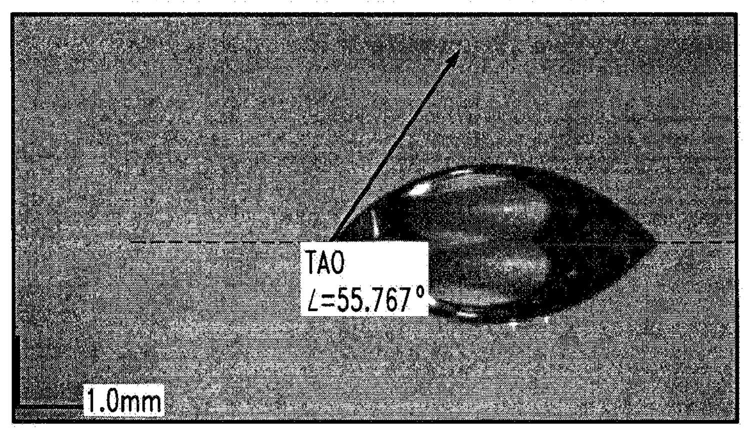
FIG. 15 is a photograph illustrating a typical contact angle of a drop of water deposited on a non-treated (i.e., prior art) metal surface; an FIG. 16 is a photograph illustrating the reduction in contact angle of a drop of water deposited on a plasma-treated, temporarily hydrophilic, metal surface in accordance with the principles of the present invention.
Figure 16:
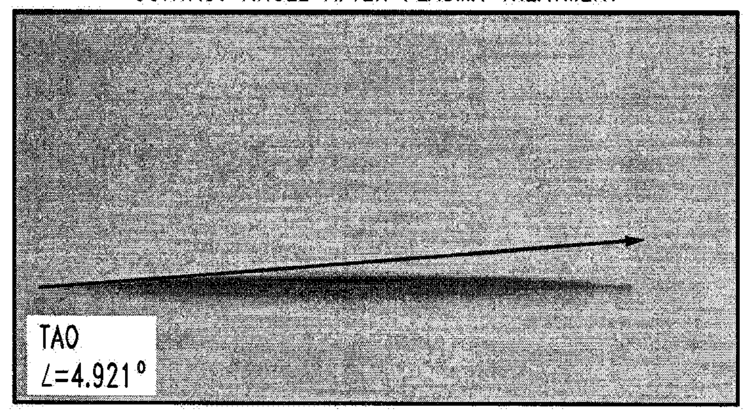

The increase in wettability of the metal surface in accordance with the present invention can be measured, for example, by analyzing the change in the contact angle of a drop of water on the surface as a result of the plasma treatment. FIG. 15 is a photograph of conventional metal contact surface with an applied drop of water. The contact angle is shown in this particular example to be about 55°. After performing a plasma treatment in accordance with the present invention, the contact angle was found to reduce to about 5°, as shown in the photograph of FIG. 16. Indeed, the increase in wettability of the metal surface by virtue of using the plasma treatment in accordance with the present invention is quite evident. These values of 55° and 5° are exemplary only; it is to be understood that in more general terms the use of a plasma treatment in the lift-off process of the present invention is successful if it provides any reduction in contact angle. Obviously, the improvement in reducing redeposit is directly related to the decrease in contact angle, where the smaller the angle after plasma treatment the more likely that redeposit will be prevented.

As an additional advantage, it has been found that performing this plasma treatment prior to lift off of the photoresist removes some residual organic contaminants from the structure. The removal of these contaminants thus further improves the yield of functioning die from a wafer.

It is also to be understood that an $O_2$-based plasma is only one exemplary type of plasma treatment that may be used in accordance with the principles of the present invention to create a hydrophilic metal surface prior to photoresist lift off. In another embodiment of the present invention, a $CF_4$-based plasma treatment may be used to increase the wettability of the metal surface. Indeed, an exemplary $CF_4$-based plasma treatment has been found to create an improved hydrophilic state with respect to an $O_2$-based plasma treatment, in terms of a measured contact angle (i.e., a contact angle less than) 5°. In one particular set of conditions, a $CF_4$-based plasma treatment was performed at a pressure of 1.50 torr, with an $O_2$ flow (pure oxygen) of 39 sccm and a $CF_4$ flow of 13 sccm. The RF power of the plasma was maintained at about 100 W in one exemplary process, and the treatment was applied for various time intervals, ranging from 45 sec to 180 sec. While providing an improved wettability of the metal surface, the $CF_4$-based plasma treatment was found to be more aggressive than an $O_2$-based treatment, etching away a portion of the photoresist as well as the semiconductor material under the photoresist. In certain cases where the etching may not be of importance, the use of a $CF_4$ plasma provides even less of a chance for the metal contact to redeposit and is considered a design choice by the manufacturer. Indeed, other gas sources and plasma process conditions are contemplated as available design choices for the improved lift-off process of the present invention, the requirement being the creation of a hydrophilic state across the surface of the applied contact metal that is sufficient to at least reduce the occurrence of metal redeposit on the substrate surface.

The description hereinabove has been presented with reference to the embodiments depicted in the drawings, but they should be considered as illustrative only, and it should be understood that various modifications and changes can be made therefrom by those skilled in the art. However, these modifications should be regarded as being within the scope of the present disclosure. Therefore, the scope of the present invention is considered to be defined by the appended claims.

What is claimed is:

1. A method of manufacturing a semiconductor device using a lift off process, comprising forming a layer of photoresist over a top major surface of a substrate processed to include regions of the semiconductor device;

patterning the layer of photoresist to expose selected regions of the top major surface of the substrate, the selected regions associated with the provision of electrical connection to the semiconductor device;

depositing a metal contact layer over the patterned layer of photoresist material and the exposed selected regions of the top major surface;

exposing the metal contact layer to a plasma treatment under conditions sufficient to create a hydrophilic surface on the metal contact layer; and removing the layer of photoresist material and portions of the metal contact layer that are deposited over the layer of photoresist material using a lift-off solvent, wherein the creation of the hydrophilic surface reduces redeposit of portions of the removed metal contact layer on exposed regions of the top major surface of the substrate.

2. The method as defined in claim 1 wherein the metal contact layer comprises a multi-layer structure.

3. The method as defined in claim 2 wherein the multi-layer structure comprises a three layer stack of Ti, Pt and Au.

4. The method as defined in claim 1 wherein the plasma treatment utilizes an $O_2$-based plasma process.

5. The method as defined in claim 4 wherein the $O_2$-based plasma process utilizes Ar as a carrier gas.

6. The method as defined in claim 4, wherein the $O_2$-based plasma process is performed at a pressure of about 2.75 Torr with an RF power of about 175 W.

7. The method as defined in claim 6 wherein the $O_2$-based plasma process includes the step of providing an input flow of gaseous $O_2$/Ar at a flow rate of about 33 sccm.

8. The method as defined in claim 7 wherein the $O_2$-based plasma treatment is applied for about one minute.

9. The method as defined in claim 1 wherein the plasma treatment utilizes a $CF_4$-based plasma process.

10. The method as defined in claim 9 wherein the $CF_4$-based plasma process uses pure oxygen as a carrier gas.

11. The method as defined in claim 10 wherein the $CF_4$-based plasma process includes the step of providing an input flow of gaseous pure oxygen at a flow rate of about 39 sccm and an input flow of gaseous $CF_4$ at a flow rate of about 13 sccm.

12. The method as defined in claim 9 wherein the $CF_4$-based plasma process is performed at a pressure of about 1.50 Torr with an RF power of about 100 W.

13. The method as defined in claim 12 wherein the $CF_4$-based plasma treatment is applied for about one minute.

14. The method as defined in claim 1 wherein the step of performing a plasma treatment creates a hydrophilic surface with a contact angle no greater than about 5°.

* * * * *